United States Patent
Yanagisawa et al.

(10) Patent No.: US 7,233,156 B2
(45) Date of Patent: Jun. 19, 2007

(54) CAPACITY LOAD TYPE PROBE, AND TEST JIG USING THE SAME

(75) Inventors: Wasuke Yanagisawa, Tokyo (JP); Makoto Nakakoji, Tokyo (JP); Ryo Horie, Tokyo (JP); Takuto Yoshida, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 10/503,669

(22) PCT Filed: Feb. 6, 2003

(86) PCT No.: PCT/JP03/01277

§ 371 (c)(1),
(2), (4) Date: Aug. 6, 2004

(87) PCT Pub. No.: WO03/067268

PCT Pub. Date: Aug. 14, 2003

(65) Prior Publication Data

US 2005/0088189 A1    Apr. 28, 2005

(30) Foreign Application Priority Data

Feb. 7, 2002  (JP) ............................ 2002-031389

(51) Int. Cl.
*G01R 31/02* (2006.01)
(52) U.S. Cl. .................................................... 324/754
(58) Field of Classification Search ............... 324/754, 324/757, 761–762, 765, 158.1, 72.5; 439/71–73
See application file for complete search history.

(56) References Cited

U.S. PATENT DOCUMENTS 4,724,180 A    2/1988  Kern (Continued)

FOREIGN PATENT DOCUMENTS

JP    58-034364 A    2/1983

(Continued)

OTHER PUBLICATIONS

International Search Report for PCT/JP03/01277 mailed on May 20, 2003.

(Continued)

*Primary Examiner*—Ha Tran Nguyen
*Assistant Examiner*—Tung X. Nguyen
(74) *Attorney, Agent, or Firm*—Rader, Fishman & Grauer PLLC

(57) ABSTRACT

A plurality of probes such as a signal probe (3) and a power supply probe (4) are provided into a metal block (1) so as to penetrate. Each of the probes has a movable pin (11). A tip of the movable pin is projecting from one surface of the metal block (1). And a projection length of the tip is variable. A DUT 20 is pressed onto the surface of the metal block (1) to contact between electrode terminals (21 to 24) and tips of the probes to test characteristics of the DUT. At least one of the probes is capacity loaded probe having a capacitor by providing a dielectric layer and a metal film to peripheral of the probe. As a result, noise can be removed reliably. Additionally, when the capacity loaded probe is used as the power supply probe, a voltage drop is reduced at the power supply terminal in a case of change of the output.

5 Claims, 8 Drawing Sheets

U.S. PATENT DOCUMENTS

| | | | |
|---|---|---|---|
| 5,512,838 A * | 4/1996 | Roach | 324/754 |
| 5,525,911 A * | 6/1996 | Marumo et al. | 324/754 |
| 5,532,613 A * | 7/1996 | Nagasawa et al. | 324/761 |
| 6,046,597 A * | 4/2000 | Barabi | 324/755 |
| 6,420,889 B1 * | 7/2002 | Terada | 324/755 |
| 6,700,397 B2 * | 3/2004 | Hollman et al. | 324/762 |
| 6,727,716 B1 * | 4/2004 | Sharif | 324/754 |
| 6,784,679 B2 * | 8/2004 | Sweet et al. | 324/761 |
| 6,844,748 B2 * | 1/2005 | Sato et al. | 324/754 |

FOREIGN PATENT DOCUMENTS

| | | |
|---|---|---|
| JP | 58-175273 A | 10/1983 |
| JP | 61-056981 A | 3/1986 |
| JP | 62-96578 U | 6/1987 |
| JP | 01-128536 A | 5/1989 |
| JP | 01-133280 U | 11/1990 |
| JP | 06-216205 A | 8/1994 |
| JP | 07-260878 A | 10/1995 |
| JP | 10-213583 A | 11/1998 |
| JP | 2001-042002 A | 2/2001 |
| JP | 2001-099889 A | 4/2001 |

OTHER PUBLICATIONS

European Search Report, Application No. 03703239.8-2216 PCT/JP0301277, dated Aug. 29, 2005.

* cited by examiner

CAPACITANCE=1000pF

CAPACITANCE=100pF

CAPACITANCE=0.5pF

CAPACITY LOAD TYPE PROBE, AND TEST JIG USING THE SAME

RELATED APPLICATION DATA

The present application is 371 of PCT JP03/01277 filed on Feb. 06, 2003.

TECHNICAL FIELD

The present invention relates to a capacity loaded probe where, for example in testing a high frequency/high speed device (hereinafter high frequency means the frequency is high in analog and high speed means digital signal having a small pulse width or small pulse separation) such as a semiconductor wafer, IC, or module for an amplification circuit and mixer circuit built in, e.g., a cellular phone, reliable contact between the DUT (Device Under Test) and a test apparatus is achieved to reduce influence of external noise to the minimum, and to a test jig using the capacity loaded probe.

BACKGROUND ART

For example, to solve the problem that an exposed lead tends to pick up noise in testing a high frequency/high speed device such as a semiconductor wafer, IC, or module, a structure where electrode terminals 21 to 23 of a DUT 20 are connected to a test jig which contains an RF (this term means high frequency and high speed) signal probe 3, power supply probe 4, and ground probe 5 provided in a metal block 1, each of probes having a spring and a movable pin is disclosed in JP-A No. 99889/2001, as shown in FIG. 12(a). In such a test jig, RF signals are transmitted through a coaxial cable 7 to the RF signal probe 3, the spring is compressed to prevent a space from being formed between the DUT 20 and a thin presser board 8 on the metal block 1, and reliable contact between the RF signal probe 3 and an electrode terminal of the DUT 20 is achieved by means of the spring, thereby picking up as less noise as possible. In FIG. 12(a), 6 denotes a wiring board such as a printed circuit board in which a power supply circuit of the input side is formed.

In even such a structure, however, the probe in the metal block 1 tends to pick up noise in the high frequency/high speed device. In the above described JP-A No. 99889/2001, the RF signal probe 3 is coaxially structured, and thereby has no room for picking up noise. On the other hand, when the power supply terminal 23 picks up high frequency/high speed noise, it causes power supply voltage to change, an amplifier to oscillate, so it causes inaccurate measurement. To solve this problem, a low-pass filter 61 shown in FIG. 12(b), comprised of an LC circuit having coils L and capacitors C is formed on the wiring board (printed circuit board) 6, or a chip capacitor (bypass capacitor) is connected between the input side of the power supply probe 4 and a ground of wiring board 6, removing high frequency/high speed noise entered in the power supply circuit.

On the other hand, not only RF signals, but also various medium and low frequency signals in the range of DC level to 100 MHz are input for testing. A precise test cannot be achieved when RF noise is input to the signal terminals for medium or low frequency signals. Even if medium/low frequency input signal probes are coaxially structured, RF noise entered in the DUT side or test apparatus is input to the terminals of the DUT directly. Thus, a precise test cannot be achieved.

As described above, in order for the test jig not to be influenced by noise which the wiring connected to the DUT picks up, the portion for contact with a DUT is so structured that a contact probe having a movable pin which moves inward and outward by means of a spring is built in the metal block. In such a structure, no space between the DUT and the metal block is formed. The test jig thus hardly picks up noise. Additionally, as described above, the RF signal probe is coaxially structured in the metal block. On the other hand, with recent development of a high frequency/high speed device, its circuit has been high integrated and small packaged remarkably. Consequently, the number of the terminals (electrodes) is increased, and pitches between the terminals are shortened, so that noise tends to be superimposed not only onto a probe not built in the metal block, but also onto the power supply probe in the metal block. There is thus a problem that precise measurement without influence of noise cannot be completely achieved in the structure where the low-pass filter or chip capacitor are formed on the input side of the power supply probe.

Additionally, the present inventors found that an unexpected condition, such as an operation error and forced reset, tends to occur in testing the recent advanced high frequency/high speed device during the transition that the output becomes from low to high or high to low according to change of input signals. The reason for such a condition was found that the transition of the output voltage change becomes short and thereby the power supply current changes instantaneously to cause a voltage drop of the power supply terminal. In other words, when the source current increases stepwise, the power supply probe 4, which has a length of about 4 mm and is structured as shown in FIG. 12(a), has an inductance of about 2 nH (nano-henry) because of its narrowness. An equivalent circuit is shown in FIG. 11(a), when $C_2$ is assumed 0.5 pF (pico-farad) as a floating capacitance around the probe (in FIG. 11(a), $C_2$ shows the floating capacitance in the equivalent circuit, while a capacitor is not actually provided). As a result, when a current $I_1$ changes from $A_1$=10 mA to $A_2$=50 mA stepwise (perfect condition, zero rise time), the voltage drops from 3 V to about 1.7 V, as shown in FIG. 11(c), causing an obstacle in the test data.

An object of the present invention is to solve such problems, in other words, to provide a capacity loaded probe which, for testing a high frequency/high speed device, almost influence of a voltage drop at the power supply terminal due to the presence of inductance, even if a pitch of power supply terminals is shortened and power supply probe is narrowed, because the device is highly integrated and small packaged.

Another object of the present invention is to provide a capacity loaded probe for achieving a noise-free precise test of a high-integrated high frequency/high speed device by reducing noise according to signals which is input to the terminals, and to provide a test jig for a test apparatus using the capacity loaded probe for testing a high frequency/high speed device or the like.

DISCLOSURE OF THE INVENTION

A capacity loaded probe of the present invention includes; a metal pipe, a movable pin which is electrically connected to the pipe and which projection length projecting from at least one end portion of the metal pipe is variable, a dielectric layer provided on a peripheral of the metal pipe, and a first metal film provided on a surface of the dielectric layer, wherein a capacitance is formed between the movable pin and the first metal film.

The movable pin means a pin which tip portion is movable along its axis, such that a lead wire held by a spring moves inward by pressing a tip of lead wire with shrinkage of the spring.

When such a contact probe, which outer circumferential surface is provided with the capacitor, is used as a probe for contact with a power supply terminal and a signal terminal, a voltage drop at the power supply terminal can be avoided, and noise can be removed. Although generally in testing a DUT for RF (hereinafter means analog high frequency and digital high speed having a short pulse width or short pulse separation, and an analog or pulse repetition of about 1 GHz or more), an inductance of a power supply probe causes a voltage drop when an output current switches, e.g., from low to high, in the present invention the capacitor reduces the voltage drop to the safety level. This means that, with adding the capacitor, the compensation is achieved by the charge and discharge of the capacitor and the inductor.

Additionally, when the capacity loaded probe is used as the power supply probe and signal probe which is connected to the signal terminal for substantially DC level input signals or for medium/low frequency sine waves and digital signals having small pulse repetition, the capacitor provided on the probes certainly removes RF noise entering the power supply line and signal line, and a reliable test can be achieved without influence of noise.

The concrete structure may be as follows. The dielectric layer is comprised of a dielectric cylinder. The first metal film is formed on the outer circumferential surface of the dielectric cylinder. A second metal film is provided on the inner circumferential surface of the dielectric cylinder. The second metal layer is electrically connected to the metal pipe. The dielectric layer is comprised of a thin film directly formed on the outer circumferential surface of the metal pipe, and the first metal film is formed on the thin film. The metal films provided on the inner and outer circumferential surfaces of the dielectric cylinder are formed by means of, e.g., electroless plating. With the sputtering or vacuum evaporation method, the dielectric film can be formed on a rotating metal pipe in a thin film. The dielectric film can be formed also with the sol-gel method, in which a liquid of a dielectric material dissolved in an organic solvent is applied on the outer surface of the metal pipe, and the applied material is dried and fired.

The capacitor provided on the outer circumferential surface of the metal pipe can be formed to have equal to or over two types of capacitances.

The test jig of the present invention comprises; a metal block, and a plurality of probes for power supply and signal provided into the metal block so as to penetrate, each of the probes having a movable pin, a tip portion of which is projecting from one surface of the metal block, and a projection length of the tip portion is variable, wherein the DUT is pressed onto one surface of the metal block to contact between the electrode terminals of the DUT and the tips of the probes to test characteristics of the DUT, and wherein at least one of the probes is a capacity loaded probe which has a dielectric layer and a metal film to form a capacitor.

In such a structure, because a capacitor which bypasses RF noise is formed to the peripherals at least one of the power supply and signal probes, RF noise can be bypassed just before the probes contact the power supply terminal and the signal terminal of the DUT. The capacitor can not only avoid noise, but also remove RF noise which remains on the side of the wiring board (printed circuit board). As a result, noise from the power supply and medium/low frequency signal probes having the movable pins for contact with the DUT is completely removed, achieving a precise test without influence of noise. Additionally, by using the capacity loaded probe as the power supply probe, a voltage drop at the power supply terminal caused by a current change in the DUT can be reduced to within 10 percent of a general tolerance of power supply voltage.

The capacity loaded probe may be used as at least part of the signal probes for contact with the signal input terminals of the DUT, the capacity loaded probe having a capacitance which, according to a repetition of sine waves or pulses of a signal applied to the part of signal probes, damps slightly the signals of the repetition and damps higher frequency noise than the repetition largely. As a result, in testing even a device into which various signals in the range of DC level to RF are input, RF noise can be removed without damping the input signals in accordance with the repetition of input signals. A precise test can be thus achieved. The sine wave and the pulse repetition mean a frequency for an analog signal and a high/low repetition rate for a digital signal.

The power supply probe for contact with the DUT is preferably composed of a capacity loaded probe having a capacitance of equal to or over 50 pF, preferably equal to or over 100 pF. This is because power supply voltage hardly drops by equal to or over 10 percent in response to change of input signals, high frequency noise of equal to or over 400 MHz(equal to or over 200 MHz when the capacitance is equal to or over 100 pF) can be damped by 10 dB or more, and high RF noise can be damped more largely, removing noise almost completely.

BEST MODE FOR CARRYING OUT THE INVENTION

Figure 1:
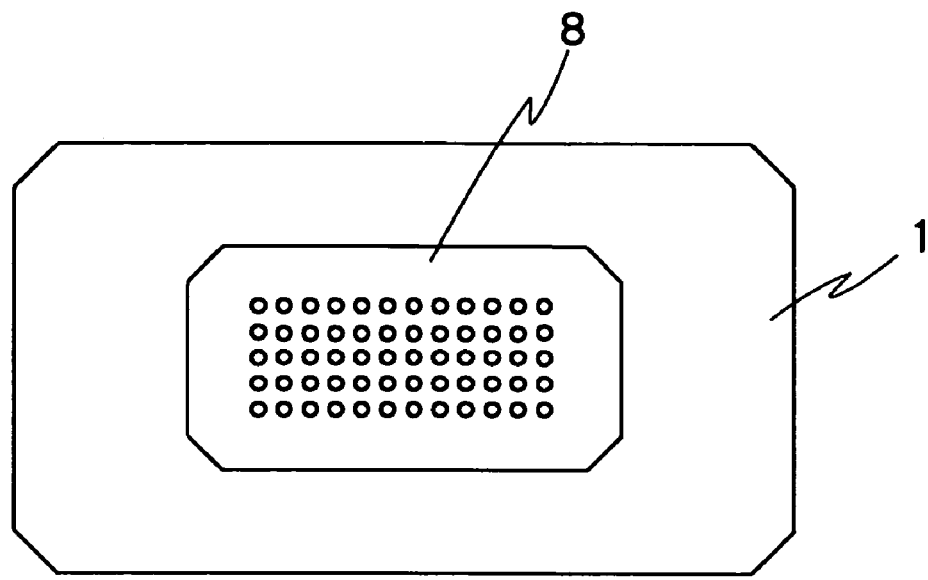
FIGS. 1(a) and 1(b) are a top view and partial sectional side view of one embodiment of a test jig according to the present invention.
Figure 1:
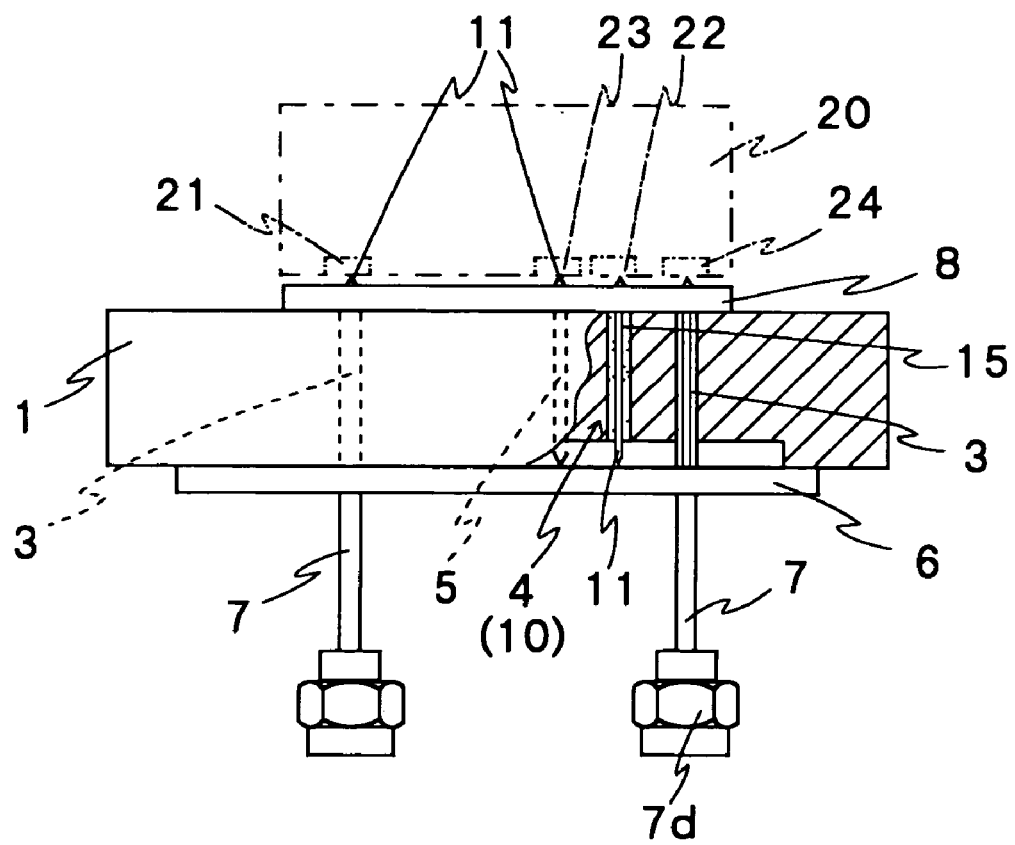

Next, a capacity loaded probe of the present invention and a test jig using the probe will be explained in the following in reference with the drawings. The test jig of the present invention connects between a DUT 20 and a test apparatus (not shown). As shown in the top view and partial sectional views of FIGS. 1(a), (b), a plurality of probes such as a signal probe 3, power supply probe 4, and ground probe 5 are provided into a metal block 1 so as to penetrate. Each of the probes has a movable pin 11. A tip of the movable pin 11 is projecting from one surface of the metal block 1. A projection length of the tip is variable. The DUT 20 is pressed onto the one surface of the metal block 1. Each of electrode terminals 21 to 24 of the DUT 20 contacts the tips of the probes 3 to 5 to test characteristics of the DUT 20. In this invention, at least a part of the probes is capacity loaded probe whose outer circumferential surface is provided with dielectric layer and metal film to form a capacitor.

Figure 2A:
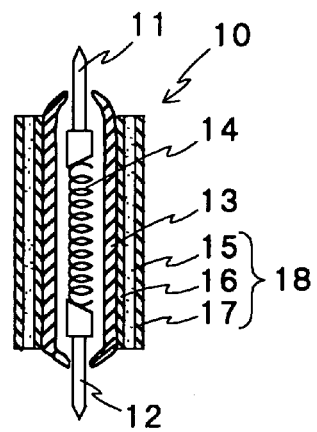
FIGS. 2(a) and 2(b) are a sectional view of a capacity loaded probe shown in FIG. 1 and a perspective view of a dielectric cylinder therein.

As shown in the sectional view of one embodiment in FIG. 2(a), a capacity loaded probe 10 has a metal pipe 13. Movable pins 11, 12 are provided in and electrically connected to the metal pipe 13. Tips of the pins are projecting from at least one end of the metal pipe 13. Projection lengths of the tips are variable. A dielectric layer 15 is provided on the outer circumferential surface of the metal pipe 13. A first metal film 17 is provided on the outer circumferential surface of the dielectric layer 15. As a result, a capacitance is formed between the movable pin 11 and the first metal film 17.

As shown in FIG. 2, the dielectric cylinder 15 which is cylindrically shaped is used as a dielectric layer forming the capacitor 18. A second metal film 16 and the first metal film 17 are provided on the inner and outer circumferential surfaces of the dielectric cylinder 15 by means of electroless plating to form the capacitor 18. As a result, no space on both sides of the dielectric is formed, and the capacitance efficiently works. The second metal film 16 is electrically connected to the metal pipe 13.

Figure 2B:
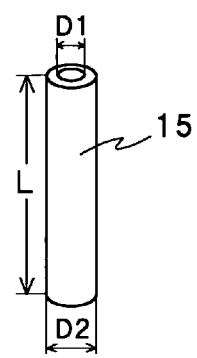

As shown in the perspective view of FIG. 2(b), the dielectric cylinder 15 has an inner diameter D1 of about 0.3 mm, an outer diameter D2 of about 0.6 mm, and a length L of about 6 mm. The reason for such dimensions is as follows. As described above, the number of electrode terminals has increased because of high integration of ICs. Recently, the electrode terminals are formed not only on the perimeter of a chip, but also on the whole area of the chip by means of BGA (Ball Grid Array) packaging. Additionally, the number of electrode terminals may be up to 400 per 1 cm$^2$, so that spaces between probes become extremely narrow. The power supply and ground terminals respectively share about ¼ of the electrode terminals. The rest are input/output terminals for signals such as RF signals.

Figure 3:
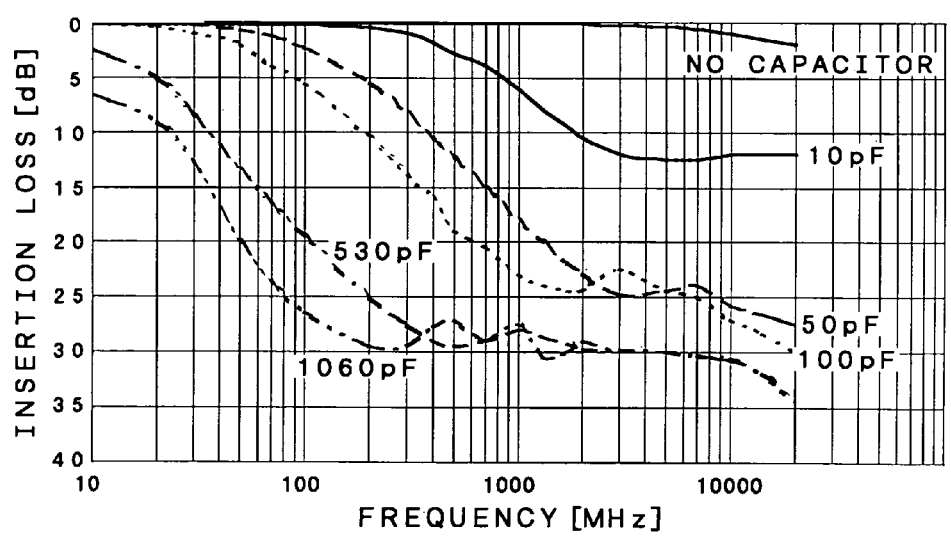
FIG. 3 shows frequency characteristics of insertion loss by a simulation when a capacitance loaded in a probe is changed.

The present inventors tested effect of the capacitor 18 by simulating the insertion losses for frequencies, in other words, the noise removal level when a capacity loaded probe having a capacitor formed on its outer circumferential surface is connected. FIG. 3 shows the results. In FIG. 3, the vertical (top-to-bottom) line shows insertion losses for the frequencies when capacitance of the capacitor of FIG. 2(a) changes variously, where the capacitances are 10 pF, 50 pF, 100 pF, 530 pF, and 1060 pF. The curve of no capacitor shows frequency characteristics of a conventional probe.

Generally, when there is an insertion loss of about 10 dB, noise is removed largely, and when there is an insertion loss of about 20 dB, noise is almost perfectly removed. The results of FIG. 3 are as follows. A capacitance of 1060 pF can remove noise of a frequency of equal to or over about 25 MHz, and remove perfectly noise of a frequency of equal to or over about 50 MHz. A capacitance of 100 pF can remove RF noise of equal to or over 1 GHz perfectly. A capacitance of equal to or over 50 pF can damp the RF noise sufficiently. In a conventional probe having no capacitor (assumed to have a floating capacitance of about 0.5 pF), when a frequency is equal to or under 20 GHz, an insertion loss is equal to or below 2 dB, removing almost no RF noise.

On the other hand, the present inventors found the following fact. A capacitance of 50 pF damps almost no signal within several dozen megahertz band, and damps noise of equal to or over 1 GHz largely. For example, by loading a capacitor having a capacitance of about 50 pF to a signal probe to which signals are input, a reliable test can be achieved because the signals from which RF noise has been removed are input to the signal probe. As a result, instead of a coaxially structured probe, a probe loading a capacitor having a capacitance which does not damp a signal but damps the noise having a frequency higher than that of the signal is preferably used as a signal probe.

To change such a capacitance, a material having a different dielectric constant is used for the dielectric layer 15, and a thickness of the dielectric layer 15 or a length of a probe is changed. For example, barium titanate (a relative dielectric constant of 2200) often used as ceramic, and ceramic (a relative dielectric constant of about 38) called high dielectric constant ceramics are used to form probes having the above described capacitances, the probes being structured as shown in FIGS. 2(a) and 2(b) by using dimensions shown in Table 1. Additionally, the capacitance can be adjusted arbitrarily by changing its material and thickness. In particular, as described below, by forming the dielectric layer with a thin film, the capacitance can be thus adjusted arbitrarily, and increased.

TABLE 1

Examples of forming capacitors

| Capacitance [pF] | Length L [mm] | Inner diameter D1 [mm] | Outer diameter D2 [mm] | Dielectric material |
|---|---|---|---|---|
| 1060 | 6.0 | 0.3 | 0.6 | barium titanate |
| 530 | 3.0 | 0.3 | 0.6 | barium titanate |
| 100 | 1.0 | 0.3 | 1.0 | barium titanate |
| 50 | 0.5 | 0.3 | 1.0 | barium titanate |
| 10 | 3.3 | 0.3 | 0.6 | high dielectric constant ceramics |

Figure 4:
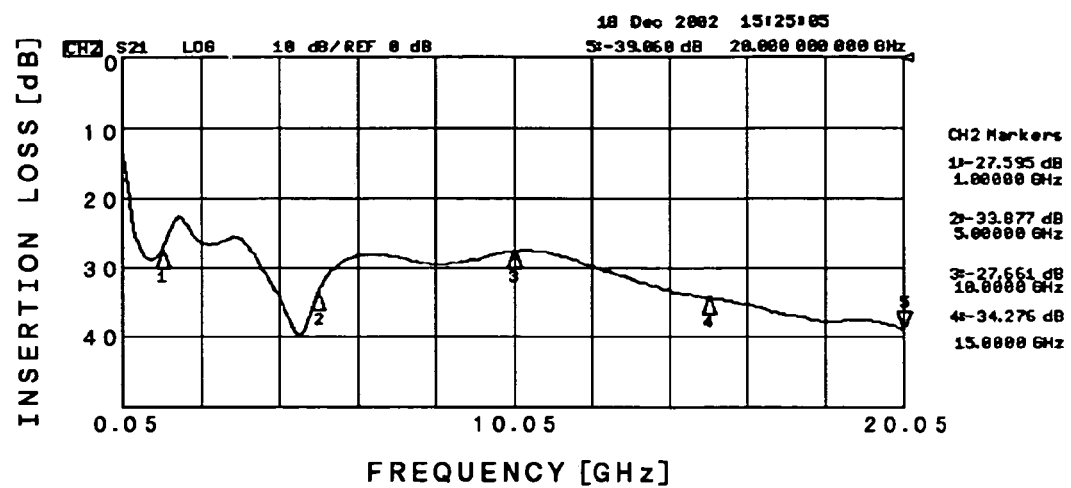
FIG. 4 shows frequency characteristics of insertion loss measured by the input-output test when the capacitance is 470 pF, which is set as one example.

Actually, insertion losses for frequencies were tested using a capacity loaded probe structured according to the dimensions of the capacitor having a capacitance of 530 pF as shown in Table 1. FIG. 4 shows the result. The actual capacitance of the capacitor was 470 pF. As shown in FIG. 4, as well as in FIG. 3, an insertion loss of about 15 dB can be obtained for 50 MHz, and an insertion loss of about over 20 dB can be obtained for 200 MHz, removing noise almost perfectly. In FIG. 4, an arrow 1 indicates 1 GHz, 27.595 dB, an arrow 2 indicates 5 GHz, 33.877 dB, an arrow 3 indicates 10 GHz, 27.661 dB, an arrow 4 indicates 15 GHz, 34.276 dB, and an arrow 5 indicates 20 GHz, 30.060 dB.

A capacitance of about 500 pF, by which a large insertion loss can be obtained for a noise in the range of sufficient low frequency to high frequency, is sufficient for a power supply probe and input signals of a substantially DC level small repetition (low frequency). As shown in FIG. 3, A sufficient insertion loss is obtained for 200 MHz or over by using a capacitance of 100 pF, which is useful for the power supply probe.

On the other hand, as described above, the inventors found that, because of inductance components of the power supply probe, a voltage drop occurs at a power supply terminal during the transition of the output when a signal changes, and thereby a precise test may not be achieved. By using a capacity loaded probe as the power supply probe, the voltage drop was reduced, in level of 10 percent or below, to the safety level. The effect for preventing the voltage drop at a power supply terminal when the capacity loaded probe is used as a power supply probe will be explained in the following.

Figure 5:
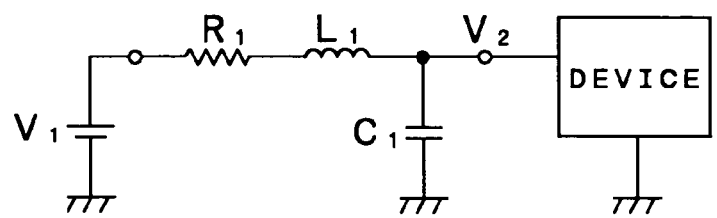
FIG. 5 is the equivalent circuit when a capacity loaded probe is used as a power supply probe.
Figure 6:
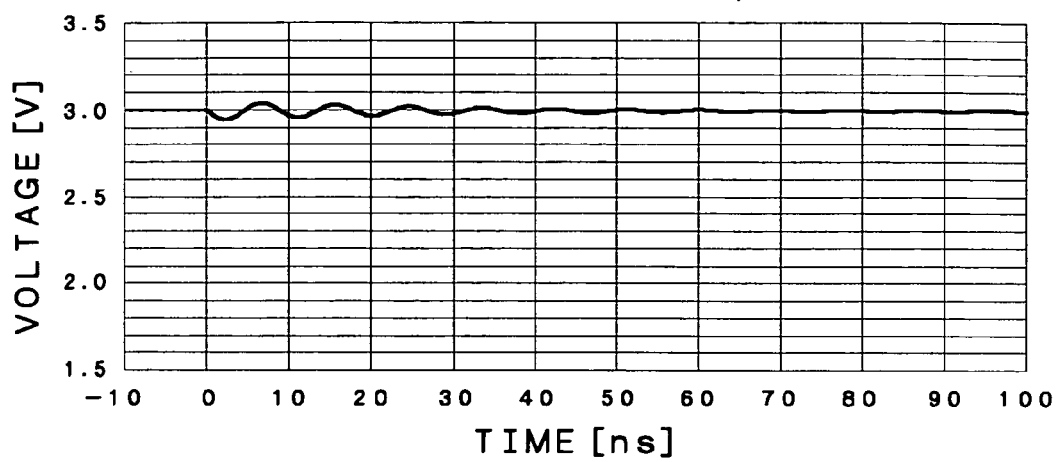
FIGS. 6(a) to 6(c) show the result of a simulation of comparing the voltage drops when capacitances are 1000 pF and 100 pF and when there is no capacitor and the floating capacitance is only about 0.5 pF.
Figure 6:
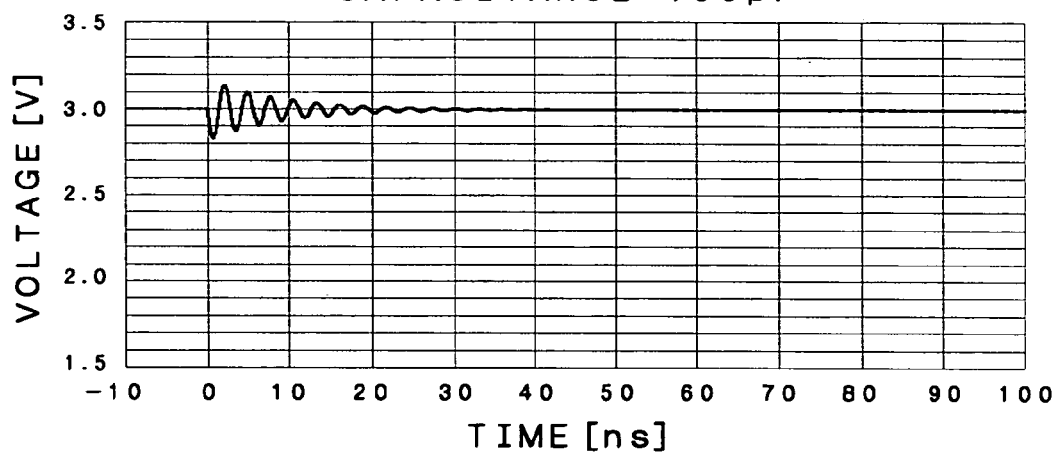
Figure 6:
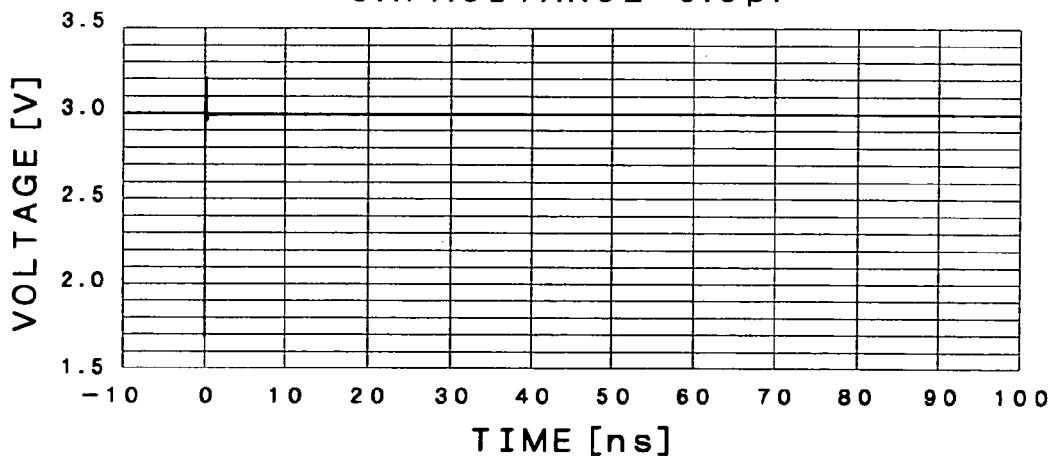
Figure 11A:
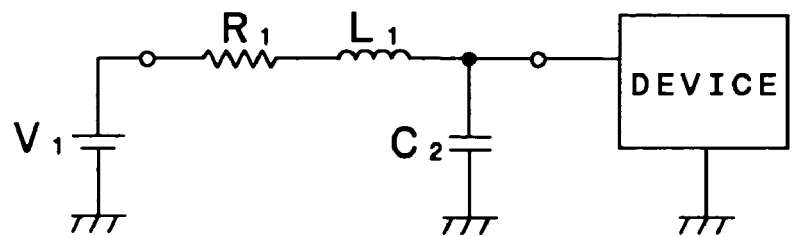
FIGS. 11(a) to 11(c) are views showing the voltage drops at a power supply terminal when switching waveform is output.
Figure 11B:
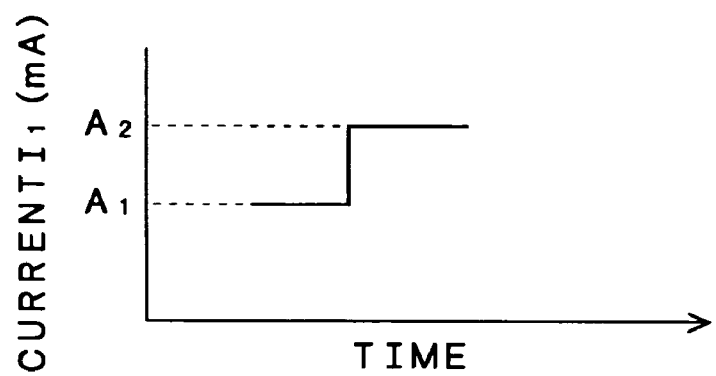
Figure 11C:
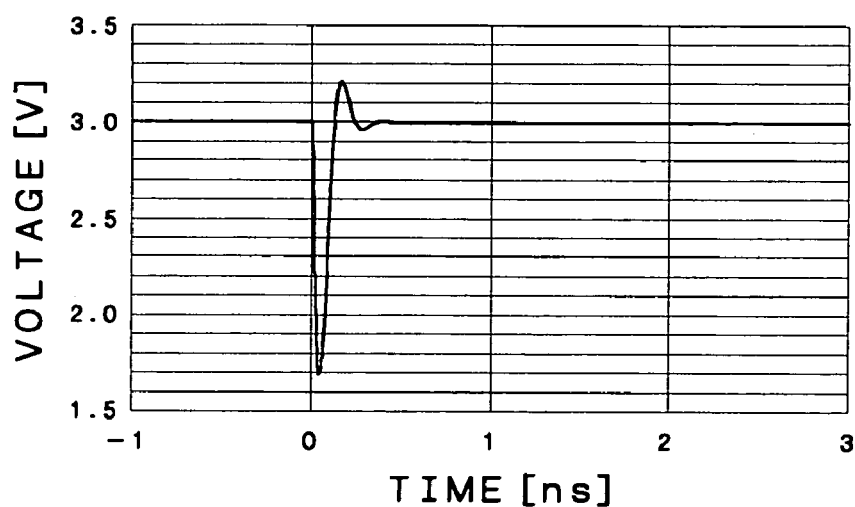
Figure 12A:
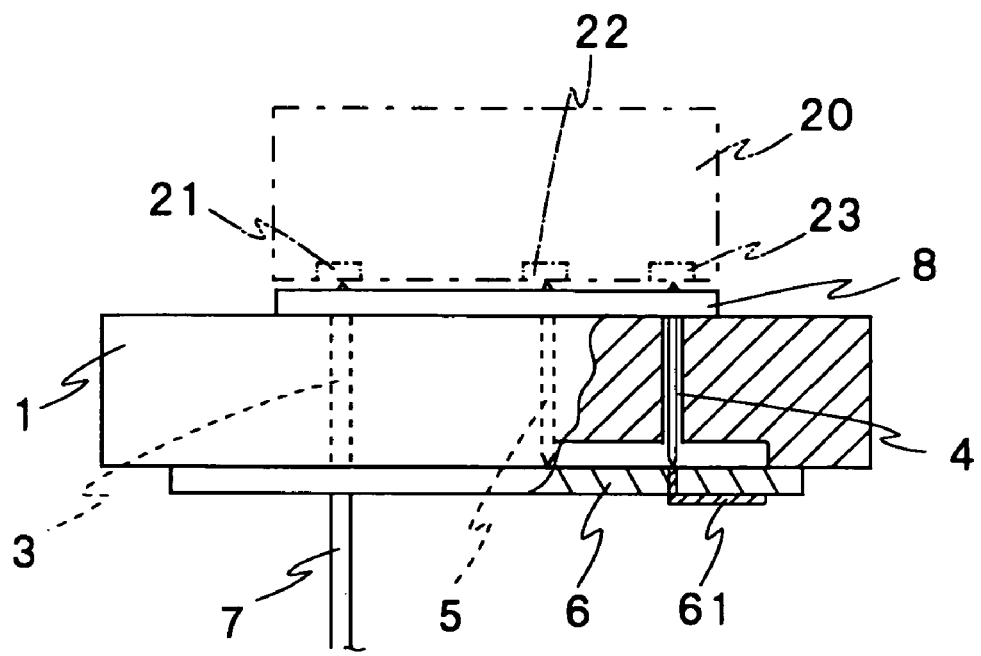
FIGS. 12(a) and 12(b) are views showing an example of a configuration of a conventional test jig for a high frequency/high speed device.
Figure 12B:
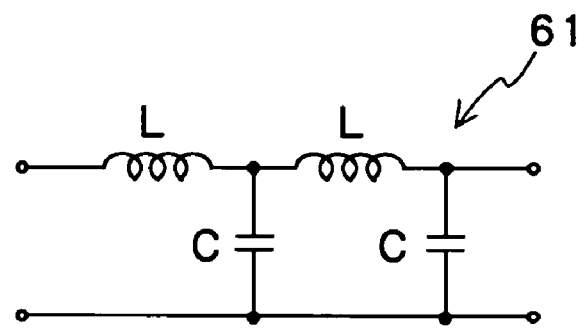

FIG. 5 shows an equivalent circuit of a portion where the capacity loaded probe contacts the terminal of the DUT, when the capacity loaded probe is used as a power supply probe. A voltage $V_2$ at the power supply terminal when, as shown in FIG. 11(b), a current changes stepwise (a zero rise time, a perfect condition) from 10 mA to 50 mA was simulated, where a power supply voltage $V_1$=3 Vdc (direct current), $R_1$=0.1 Ω, $L_1$=2 nH, $C_1$=1000 pF, 100 pF. FIGS. 6(a) and 6(b) show the results. FIG. 6(c) shows the voltage drop when a conventional probe loading no capacitor (assumed to have a floating capacitance of 0.5 pF) is used. The table of FIG. 11(c) is scaled equally to FIGS. 6(a) and 6(b). The simulations of FIGS. 11(a) to 11(c) are under the same condition.

As shown in FIGS. 6(a) to 6(c), in the probe loading a capacitor of 1000 pF, it takes long time for the voltage to stabilize but the voltage slightly changes by about 0.06 V, about 2 percent, while a large voltage drop of 1.32 V (44 percent) occurs in the conventional probe having no capacitor (assumed to have a floating capacitance of 0.5 pF). Even if the voltage pulses for a long time, its change is small, causing no influence. As shown in FIG. 6(b), when a capacitor having a capacitance of 100 pF is loaded, the voltage change at the power supply terminal is large compared to when a capacitor having a capacitance of 1000 pF is loaded, but is only about 0.18 V, about 6 percent, clearing the general voltage change limit, 10 percent. As a result, by using a probe loading a capacitor having a capacitance of equal to or over 100 pF, when a sudden current change occurs, the voltage change can be reduced to the safety level.

From one point of view, it is considered that, by using the capacity loaded probe as the power supply probe to avoid the voltage change at the power supply terminal, the voltage may be compensated by charge and discharge of the loaded capacitance and the inductance of the power supply probe. Even if a signal causes an output of the DUT to momentarily change from low to high or high to low, a voltage change at the power supply terminal can be reduced. As a result, there is no possibility that an operation error and forced reset of the DUT occur, achieving a stable test. Many power supply terminals are formed to one high frequency/high speed device to make routes thereof as less as possible. A sufficient loaded capacitance for many power supply terminals can be obtained by using many power supply probes in parallel. Even if all the power supply probes are not capacity loaded probes, voltage drop reduction and noise removal can be achieved by the power supply probes.

As described above, the capacity loaded probe 10 is preferably used as the power supply probe 4 to remove noise on the power supply line and to prevent the power supply change. This is because, in a probe loading a large capacitance, even low frequency noise can be damped by the large insertion loss, and the insertion loss for high frequency noise becomes larger, reducing the voltage change at the power supply terminal. As described above, a capacitance of equal to or over 100 pF is perfect for, and a capacitance of equal to or over 50 pF is sufficient for the noise removal and voltage change reduction. With high integration of devices, a probe is required to be narrow. The area for the capacitor cannot be extended. Thus, a dielectric having as a large dielectric constant as possible is preferably used as the dielectric layer 15.

On the other hand, in signal probes, there are various signal lines for from a substantially DC level signal to an RF signal of equal to or over 1 GHz. RF noise of equal to or over 1 GHz may be superimposed on a medium/low frequency signal line for signals of equal to or under about 100 MHz, and is required to be selectively removed. By using a capacity loaded probe having a capacitance selected according to a frequency of a signal applied to a signal terminal, noise can be certainly removed, and a reliable test can be achieved.

For example, a material having a relatively large dielectric constant such as barium titanate (a relative dielectric constant of about 700 to 20000) and strontium titanate (a relative dielectric constant of about 1500 to 4000), and fired ceramic such as high dielectric constant ceramic (a relative dielectric constant of about 10 to 50) and alumina (a relative dielectric constant of about 9 to 10) can be used as a dielectric of such a capacity loaded probe using the above described dielectric cylinder. A material having a relatively large dielectric constant such as barium titanate and strontium titanate is preferably used to form a capacitor of a power supply probe. This is because a capacitance of equal to or over about 1000 pF which bypasses high frequency noise almost completely and removes even low frequency noise easily can be obtained even if the power supply probe is small, having inner and outer diameters of 0.3 mm, 0.6 mm and a length of about 6 mm.

As described below, a thin film can be formed directly on the outer surface of the metal pipe 13, instead of on the dielectric cylinder. In addition to the above described materials, compounds using bismuth, such as lead titanate, lead zirconate titanate (PZT; a relative dielectric constant of about 700 to 1000), lead lanthanum zirconate titanate (PLZT), barium strontium titanate (BST; a relative dielectric constant of about 1000 to 3000), strontium bismuth tantalum (SBT), and bismuth titanate (BIT; a relative dielectric constant of about 150 to 220), can be used to form the thin film.

These compounds, which can form a thin film of about 5 to 20 μm, have a relative large dielectric constant. Thus, a capacitor having a larger capacitance is easily formed by using these compounds.

In the above described dielectric cylinder type capacitor, since an electrical current does not flow through the capacitor, a problem about conductivity of the electrode does not often occur. However, when the dielectric and electrode metal do not contact each other, a space having a low dielectric constant is formed, decreasing the capacitance. Thus, the metal films are preferably formed in contact with the inner and outer circumferential surfaces of the dielectric cylinder 15. Accordingly, the inner circumferential surface of the dielectric cylinder 15 is plated with Ni by means of electroless plating, and if necessary, the plated surface is further plated with gold and silver, forming a second conductive film 16. A first conductive film 17 is formed also on the outer circumferential surface of the dielectric cylinder 15 by means of the electroless plating. A plating liquid hardly penetrate into the dielectric cylinder 15, which has a very small diameter of about 0.3 mm. Therefore, by means of a vacuum purge and ultrasonic agitation, the plating liquid extends over the inner wall with the capillary tube effect, so that the inner circumferential surface can be plated.

Figure 7:
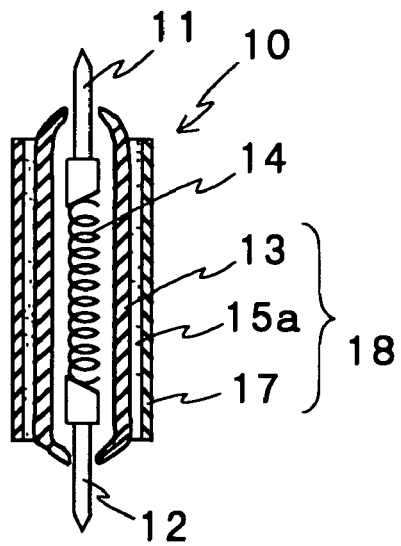
FIG. 7 is a sectional view showing another embodiment of a capacity loaded probe.

FIG. 7 shows that, as a dielectric layer of a capacitor, a dielectric thin film 15a is formed directly on the surface of the metal pipe 13, instead of the dielectric cylinder. In this example, to form the thin film directly on the outer surface of the metal pipe 13, a dielectric material is attached on the outer surface of the metal pipe 13 by means of the sputtering method, vacuum evaporation method, and laser ablation method. Further it may be attached by means of the sol-gel method, in which a dielectric material dissolved in an organic solvent is applied on the outer surface of the metal pipe 13, and then is dried and fired. As a result, a thin film of about 5 to 20 µm can be formed, and thereby a capacitor having a large capacitance can be formed. A withstand voltage of the insulating film, e.g., PZT having a thickness of 10 µm, is about 50 V, so that the insulating film can be practically used. When PZT having a dielectric constant of 730 was formed to have a thickness of 10 µm on the metal pipe 13 having a length of 1 mm and an outer diameter of φ0.3 mm of metal pipe 13, a capacitor having a large capacitance of 1240 pF was obtained, while having a length of ⅙ of the above described example.

When the sputtering or vacuum evaporation method is used, a film can be deposited all over the metal pipe 13 which is rotating. When the sol-gel method is used, an applied dielectric solvent is dried and fired to form a dielectric film.

Figure 8:
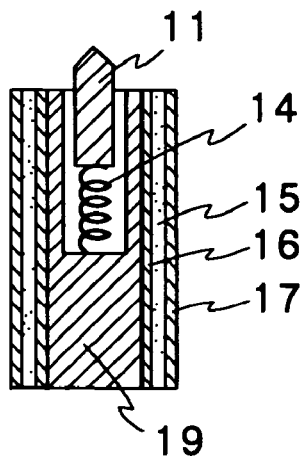
FIG. 8 is a sectional view showing a further embodiment of a capacity loaded probe.

As shown in FIG. 2(a), the movable pins 11, 12 are held by a spring 14 in the metal pipe 13 having narrow openings. When pressed, the tips of the movable pins 11, 12 move inward to compress the spring 14. In the example of FIG. 2(a), the movable pins 11, 12 are provided to both end portions of the metal pipe 13, and pressed by the spring 14 onto the wiring board 6 and the DUT 20. As shown in FIG. 8, the movable pin 11 may be provided to only the end portion for the DUT 20, as long as the end portion for the wiring board 6 is fixed with a metal body 19, and reliably connected by soldering to the wiring board 6.

As shown in FIG. 2(a), each of the movable pins 11, 12 has a diagonally-cut end portion in contact with the spring 14, so that, when pressed to compress the spring 14, the movable pins 11, 12 slant in contact with the narrow opening portions of the metal pipe 13. Electrical signals travel to the movable pin 11 via the metal pipe 13 having a low electrical resistance, instead of via the narrow spring 14, thereby reducing the impedance. As a result, RF noise hardly enters the movable pin 11. Additionally, constricted portions, not shown in FIG. 2(b), are provided to the end portions of the metal pipe 13 to prevent the movable pins 11, 12 from slipping off. The movable pins 11 of the RF signal probe 3 and ground probe 5 also have the same structure as described above.

The metal block 1 holding probes 3 to 5 for signals and power supply is a metal plate made of aluminum or brass. The metal plate has penetration holes, into which the probes are inserted.

As shown in FIG. 2(a), the signal probe 3, e.g., for medium/low frequency signals of equal to or under 100 MHz, is a capacity loaded probe having a capacitance which can be adjusted according to a frequency of an input signal. As shown in FIG. 2(a), the signal probe 3 for RF signals of equal to or over 1 GHz may have only a metal pipe in which a spring and movable pins are provided. A preferable structure of the signal probe 3 for the RF signals is as follows.

The metal pipe having a dielectric on its own outer circumferential surface is inserted into a penetration hole of the metal block 1. An outer diameter of the metal pipe and an inner diameter of the penetration hole are sized to form a coaxial structure to prevent RF noise from entering the movable pin without reducing RF signals. In the signal probe 3 for RF signals, the opposite of the end portion for contact with the DUT 20 is connected to a coaxial cable 7 such as a semi-rigid cable.

The wiring board 6 supplies power to the DUT 20. Wirings are formed on the wiring board 6. Terminals of the wiring are properly formed on positions corresponding to terminals of a DUT. In this case, as described above, a low-pass filter and a chip capacitor are formed between a power supply terminal and ground terminal on the wiring board 6. The coaxial cable 7 may be connected to the signal probe 3 via a signal wiring, which is formed on the wiring board 6, instead of directly to the end portion of the signal probe 3.

A presser board 8 is an acrylic plate, an insulating material having a thickness of about 0.1 to 0.2 mm, which is fixed with screws (not shown) and provided with penetration holes through which the movable pin 11 of each probe projects. The presser board 8 prevents the metal pipes and insulating bodies from slipping off from the metal block 1. In the example shown in FIG. 1(a), the movable pins 11 projecting from the presser board 8 are arranged in a matrix to correspond to the DUT 20 of a BGA type. The number and arrangement of the signal probes, power supply probes, and ground probes are determined according to power supply terminals of the DUT 20. One signal probe for inputting/outputting RF signals, one power supply probe, and one ground probe may be arranged.

Figure 9:
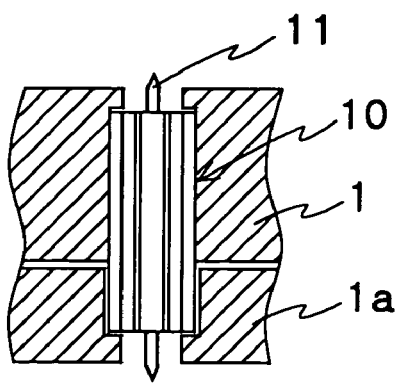
FIG. 9 is a partial sectional view showing an example of another structure for fixing a probe to a metal block.

In FIG. 1(b), one end portion of the probe is fixed by the presser board 8, which is not always necessary. The structure shown in FIG. 9 is as follows. A step for fixing the end portion of the probe is provided to the penetration hole of the metal block 1 into which the probe is inserted. A second metal block 1a having a step settles the probe, which is then screwed (not shown), from the side of the second metal block 1a, to the metal block 1. The movable pin 11 is movable in the probe 10 which is fixed.

Figure 10:
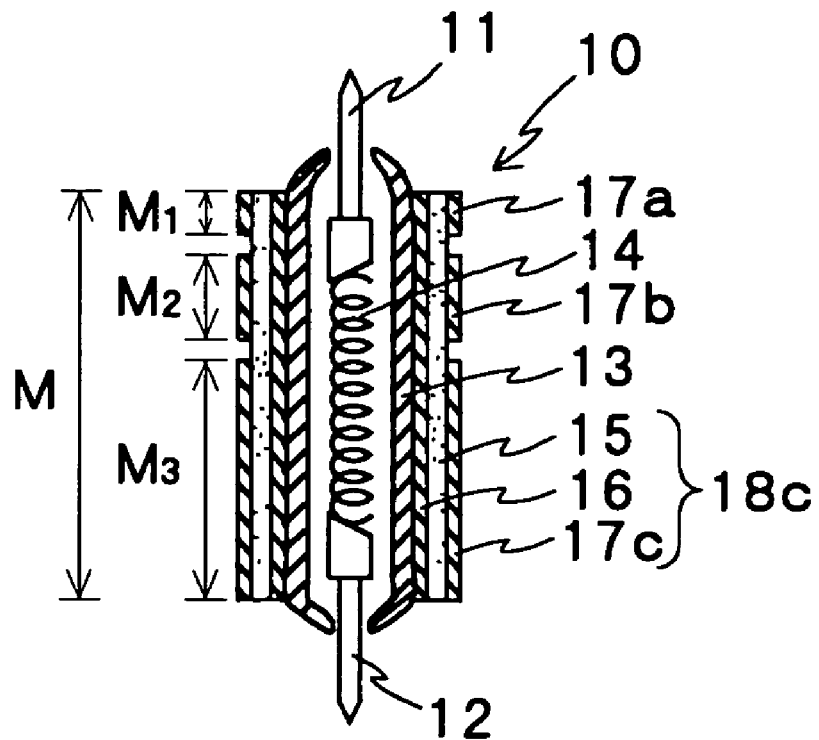
FIGS. 10(a) and 10(b) are sectional views showing a further embodiment of a capacity loaded probe and an equivalent circuit thereof.
Figure 10:
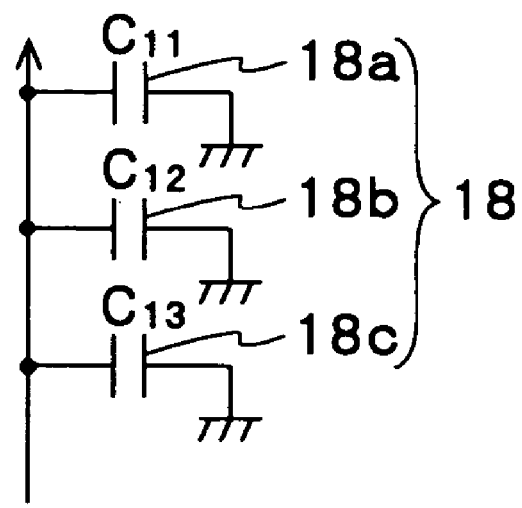

In the above described example, only one type of capacitor is formed to the peripheral of the metal pipe 13. As shown in FIG. 10(a), the first metal film is divided into metal films 17a, 17b, and 17c respectively having different lengths $M_1$, $M_2$, and $M_3$. Then, as shown in FIG. 10(b), capacitors 18a, 18b, and 18c having different capacitances are formed. Capacitors $C_{11}$ to $C_{13}$ are given capacitances into which the capacitance for the overall length M is divided in proportion to the lengths $M_1$ to $M_3$, respectively. As a result, when the above described signal probe is required to have a capacitance for a frequency of a signal, only a metal film having the required capacitance is selected from the metal films 17a to 17c to contact the metal block 1, and a capacitor having the required capacitance is obtained. The capacitor has a different high frequency characteristic according to the material and thickness of its own dielectric in selecting a capacitance required for a signal frequency. Such a frequency characteristic as cannot be obtained using one type of dielectric material can be obtained by connecting all the metal films to the metal block.

According to the present invention, because a movable pin contacts a DUT, there is no lead exposure on a portion for contact with an electrode terminal of the DUT. Additionally, because a capacitor is formed to the peripheral of a power supply probe for contact with a power supply terminal of the DUT, RF noise can be reduced just before it is input to the power supply terminal, achieving a noise-free test. In testing a high frequency/high speed device, because even an extremely short lead tends to pick up noise, noise needs to be removed as close to the DUT as possible. In the present invention, a capacitor is formed to the power supply probe for contact with the DUT, removing noise efficiently, and reducing a voltage drop at a power supply terminal to the minimum, the voltage drop occurring when a high speed switching waveform is output.

Additionally, by using a signal probe loading a capacitor having a capacitance which damps RF noise in accordance with a signal frequency, noise superimposed in the signal components can be removed before the noise enters a signal terminal, without reducing the signal.

As a result, oscillation of an amplifier of the high frequency/high speed device can be avoided, and noise can be reduced completely from the power supply and signal terminals, achieving a reliable precise test.

As described above, in the power supply probe, a movable pin may be provided only to the end portion for contact with a DUT, and the other end portion may be directly connected by means of, e.g., soldering. Also in the ground probe, a movable pin may be provided only to an end portion for contact with the DUT, and the other end portion may be fixed. The metal block 1 and a ground terminal of the DUT can be connected via an anisotropic conductive rubber where many fine metal wires are planted and which has vertically-directed conductance and no laterally-directed conductance, instead of via a ground probe.

According to the present invention, a capacitor is provided directly to a contact probe having a movable pin which can, by means of only pressure, contact a power supply terminal of a DUT. So, in testing characteristics of a high frequency/high speed device, the contact probe contacts the DUT steadily to avoid a voltage drop at the electrode terminal and to avoid a noise entry from the power supply and signal terminals. Additionally, by adjusting a capacitance of the capacitor, only noise can be damped at the signal terminal while not degrading the signal. As a result, an extremely reliable precise test can be achieved, increasing the reliability of testing a high frequency/high speed device.

INDUSTRIAL APPLICABILITY

The present invention is applicable to a field where particularly a high frequency/high speed device such as an amplification circuit, a mixer circuit, a filter circuit, an IC, a module, a high speed digital processing IC [DSP (Digital Signal Processor), a CPU (Central Processing Unit), an FPGA (Field Programmable Gate Array)], a high speed memory, and a serial-parallel conversion IC [SER/DES (serializer/de-serializer)] is tested by a contact of a probe.

What is claimed is:

1. A capacity loaded probe for power supply comprising:
   a hollow metal pipe;
   a movable pin that slides axially within said hollow metal pipe and is provided in and electrically connected to said hollow metal pipe directly, a projection length of said movable pin projecting from at least one end portion of said hollow metal pipe being variable;
   a dielectric layer provided directly on an outer peripheral of said hollow metal pipe; and
   a first metal film provided on a surface of said dielectric layer,
   wherein a capacitance of 50 pF or more is formed between said movable pin and said first metal film.

2. A capacity loaded probe comprising:
   a hollow metal pipe;
   a movable pin that slides axially and is electrically connected to said hollow metal pipe, a projection length of said movable pin projecting from at least one end portion of said hollow metal pipe being variable;
   a dielectric layer provided on an outer peripheral of said hollow metal pipe; and
   a first metal film provided on a surface of said dielectric layer,
   wherein a capacitance of 50 pF or more is formed between said movable pin and said first metal film, and
   wherein said dielectric layer is formed from a dielectric cylinder, said first metal film is formed on an outer surface of said dielectric cylinder, a second metal film is formed on an inner surface of said dielectric cylinder, and said second metal film is electrically connected to said metal pipe.

3. The capacity loaded probe as set forth in claim 1, wherein said dielectric layer is formed from a film directly deposited on an outer surface of said metal pipe, and said first metal film is formed on said film.

4. The capacity loaded probe as set forth in claim 1, wherein at least two types of capacitances are formed on said metal pipe.

5. The capacity loaded probe as set forth in claim 2, wherein at least two types of capacitances are formed on said hollow metal pipe.

* * * * *